United States Patent
Kinstle, III

(10) Patent No.: US 10,514,732 B2
(45) Date of Patent: Dec. 24, 2019

(54) SMART COMPUTER CASE

(71) Applicant: Corsair Memory, Inc., Fremont, CA (US)

(72) Inventor: Robert Michael Kinstle, III, Fremont, CA (US)

(73) Assignee: Corsair Memory, Inc., Fremont, CA (US)

( * ) Notice: Subject to any disclaimer, the term of this patent is extended or adjusted under 35 U.S.C. 154(b) by 102 days.

(21) Appl. No.: 15/990,768

(22) Filed: May 28, 2018

(65) Prior Publication Data
US 2018/0341297 A1 Nov. 29, 2018

Related U.S. Application Data

(60) Provisional application No. 62/512,074, filed on May 29, 2017.

(51) Int. Cl.
G06F 1/18 (2006.01)
H05B 33/08 (2006.01)
H05K 7/20 (2006.01)
G06F 1/20 (2006.01)

(52) U.S. Cl.
CPC ............... G06F 1/181 (2013.01); G06F 1/20 (2013.01); G06F 1/206 (2013.01); H05B 33/0845 (2013.01); H05B 33/0857 (2013.01); H05K 7/20172 (2013.01); H05K 7/20209 (2013.01); *G06F 2200/201* (2013.01)

(58) Field of Classification Search
CPC . G06F 1/181; G06F 1/20; G06F 1/206; G06F 2200/201; H05B 33/0845; H05B 33/0857; H05K 7/20172; H05K 7/20209
See application file for complete search history.

(56) References Cited

U.S. PATENT DOCUMENTS

2007/0233402 A1* 10/2007 Li ........................... G06F 1/206
702/33

* cited by examiner

*Primary Examiner* — Robert L Deberadinis
(74) *Attorney, Agent, or Firm* — Carina Tan

(57) ABSTRACT

According to certain embodiments, a micro controller unit of a smart computer case provides, based on the identification of the smart computer case: 1) lighting control of a plurality of individually addressable LEDs associated with computer case fans, logo panels and integrated lighting features, 2) fan speed control and monitoring, and 3) monitoring of temperature sensors. According to certain embodiments, each LED need not be RGB but instead can be single color LEDs.

14 Claims, 4 Drawing Sheets

SMART COMPUTER CASE

CROSS-REFERENCE TO RELATED APPLICATIONS

The present application claims the benefit of U.S. provisional patent application Ser. No. 62/512,074, filed May 29, 2017 and entitled "Smart Computer Case," which is hereby incorporated by reference in its entirety.

TECHNICAL FIELD

The present invention is directed to smart computer cases that includes a micro controller unit for controlling various features of the smart computer case.

Figure 1:
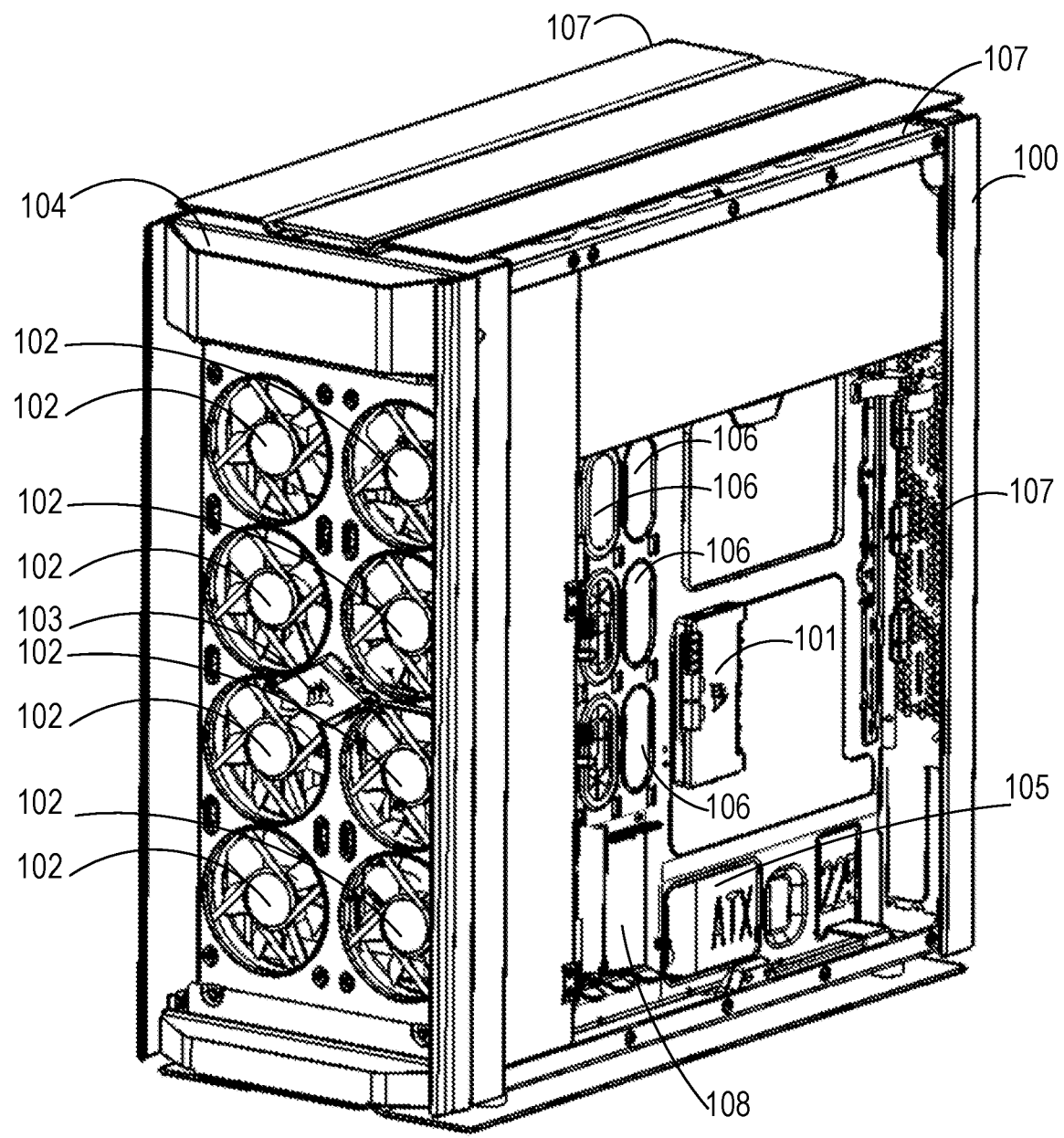
FIG. 1 is a perspective view of a smart computer case, according to certain embodiments.

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

DETAILED DESCRIPTION OF THE INVENTION

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

According to certain embodiments, a micro controller unit of a smart computer case provides, based on the ID (identification) of the smart computer case: 1) lighting control of a plurality of individually addressable RGB LEDs associated with RGB computer case fans, logo panels and integrated lighting features, 2) fan speed control and monitoring, and 3) monitoring of temperature sensors. According to certain embodiments, each LED need not be RGB but instead can be single color LEDs.

FIG. 1 is a perspective view of a smart computer case, according to certain embodiments. FIG. 1 shows smart computer case 100 with a micro controller unit (MCU) 101, a set of computer case fans 102 mounted on corresponding fan mounts (not shown) on smart computer case 100, a RGB LED logo 103, integrated RGB LED lighting features 104, a power supply 105, cable routing openings 106, computer case exhaust vents 107, and mass storage 108 [Bobby, can you look at FIG. 1 to see if this is correct?] such as a hard disk drive (HDD) or solid state drives (SSD), according to certain embodiments. Other computer components that smart computer case 100 may house but are not shown in FIG. 1 include and are not limited to: one or more cable mounted temperature sensors, a computer processing unit (CPU), a graphics processing unit (GPU), liquid CPU/GPU cooling systems, and memory modules, according to certain embodiments. According to certain embodiments, cooling system components include: radiator(s), pump(s), cold plates, tubing, chassis exhaust fans and control systems, as non-limiting examples.

According to certain embodiments, RGB LED logo 103 (with RGB LED lighting) and RGB LED lighting features 104 are integrated into smart computer case 100 during manufacture of the computer case. For example, the integrated RGB LED lighting features 104 may be implemented using RGB LED light pipes arranged in a desired pattern on one or more front panels and/or side panels and/or top panels, and/or bottom panels of smart computer case 100 or around one or more edges or seams of smart computer case 100. To explain, the location of integrated RGB LED lighting features 104 shown in FIG. 1 is only one example of where the integrated RGB LED lighting features 104 can be located. The location of the RGB LED lighting features 104 on smart computer case 100 may vary from implementation to implementation. Similarly, the integrated RGB LED logo 103 can be located in any one of many locations on smart computer case 100 and may vary from implementation to implementation. According to certain embodiments, there may be several integrated RGB LED logos 103 on smart computer case 100 and may vary from implementation to implementation. RGB LED light strips and/or RGB LED light pipes may be used to light integrated RGB LED logo 103, according to certain embodiments.

According to certain embodiments, the cable mounted temperature sensors may be placed in locations in smart computer case where it is desired to monitor the temperature. For example, it may be desired to take temperature readings around the vicinity of the CPU, GPU, or voltage regulators, etc., in smart computer case 100. According to certain embodiments, the temperature sensors may be analog sensors or digital sensors.

According to certain embodiments, the set of computer case fans 102 include RGB LED lighting on the frame of each fan (herein referred to as RGB computer case fans). Further, one or more strips of RGB LED lighting (not shown in FIG. 1) may be installed in any desired location on or in smart computer case 100. For example, one or more panels of smart computer case 100 may be transparent or translucent such that the RGB LED lighting effects of the RGB computer case fans and the installed RGB LED strips are visible from outside the smart computer case 100.

According to certain embodiments, MCU 101 controls and/or monitors RGB computer case fans 102, integrated RGB LED logo 103, integrated lighting features 104, and one or more temperature sensors.

According to certain embodiments, MCU 101 includes: 1) fan ports for controlling fan speed of the RGB computer case fans 102 (and/or non-RGB case fans) by MCU 101, 2) one or more ports for controlling RGB LED lighting strips, for controlling integrated RGB LED lighting features 104 to MCU 101, and for controlling integrated RGB LED logo 103 by MCU 101 (there are multiple RGB LED logos), and 3) one or more ports for monitoring corresponding one or more temperature sensors by MCU 101.

According to certain embodiments, the control of each RGB LED of the plurality of RGB LEDs of the integrated RGB LED logo 103, of the integrated RGB LED lighting features 104, of the RGB computer case fans 102 and of the RGB LED light strips is individually addressable. In other words, MCU 101 can control the color, intensity and animation effects of each RGB LED individually and independently of the control of the other RGB LEDs in the plurality of RGB LEDs associated with smart computer case 100 (e.g., RGB lighting in the fans, lighting that is integrated into the smart computer case, and, optionally, other RGB peripherals or components that are used by an end-user, etc.).

Figure 2:
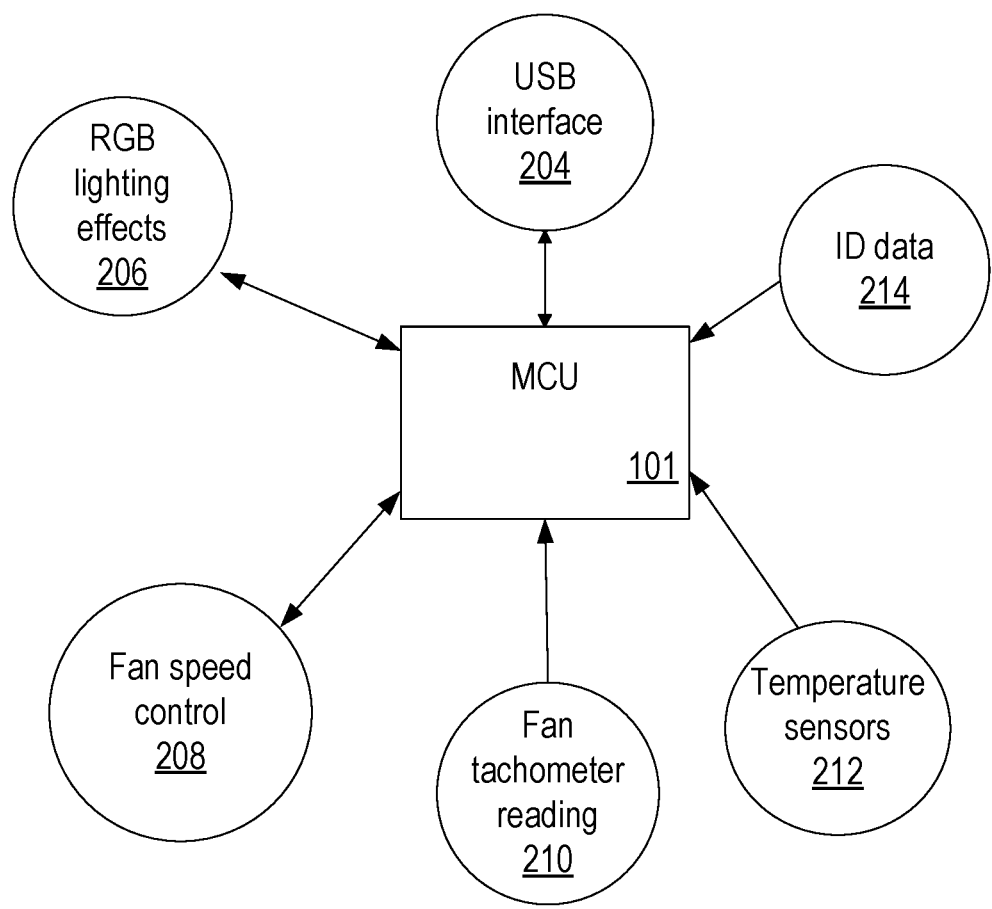
FIG. 2 is a high-level drawing of the logical relationship between a micro controller unit that is associated with the smart computer case and various components that the micro controller unit can control and/or monitor, according to certain embodiments.

FIG. 2 is a high-level drawing of the logical relationship between a micro controller unit that is associated with the smart computer case and various components that the micro controller unit can control and/or monitor, according to certain embodiments. FIG. 2 shows that MCU 101 receives ID data 214 (identification) associated with the smart computer case 100 from data storage that can be an internal or external non-volatile memory storage device. Further, FIG. 2 shows that MCU 101 controls and/or monitors various components of smart computer case 100 such as controlling lighting effects 206 associated with integrated RGB LED logo 103, integrated RGB LED lighting features 104, RGB LED lighting on RGB computer case fans 102 and the RGB LED light strips, according to certain embodiments. For example, RGB LEDs can be controlled via digital control or via pulse width modulation (PWM) signal control, according to certain embodiments. MCU 101 also controls fan speed 208 associated with each RGB computer case fan of the plurality RGB computer case fans 102, according to certain embodiments. According to other embodiments, MCU 101 controls the fans speed of a subset of RGB computer case fans 102.

As a non-limiting example, fan speed control can be via analog voltage control or via pulse width modulation (PWM) signal control. MCU 101 can also monitor fan speed by obtaining fan tachometer readings 210 of one or more of the RGB computer case fans 102 (and/or non-RGB computer case fans such as single color LED computer case fans, or even computer case fans with no LED lighting), according to certain embodiments. MCU 101 can also monitor temperature of various locations in smart computer case 100 by obtaining temperature readings 212 of one or more of the temperature sensors installed in smart computer case 100, according to certain embodiments. For example, in the case of analog temperature sensors, MCU 101 measures the voltage drop of the resistors in the temperature sensor. In the case of digital temperature sensors, the digital temperature sensors send digital information to MCU 101. According to certain embodiments, MCU 101 communicates with the host computer USB bus through USB interface 204 (or a wireless data interface such as Wifi, or Bluetooth or wireless USB). According to certain embodiments, an end-user may configure the RGB lighting effects, and fan speed control through a user interface. Thus, the end-user's configuration inputs can be communicated to MCU 101 through USB interface 204, according to certain embodiments.

According to certain embodiments, the MCU operates autonomously from the host computer that is housed by the smart computer case. The MCU can store user settings in the MCU's own non-volatile memory. Thus, the MCU can begin executing as soon as it receives power without having to wait for the operating system of the host computer to boot up.

Figure 3:
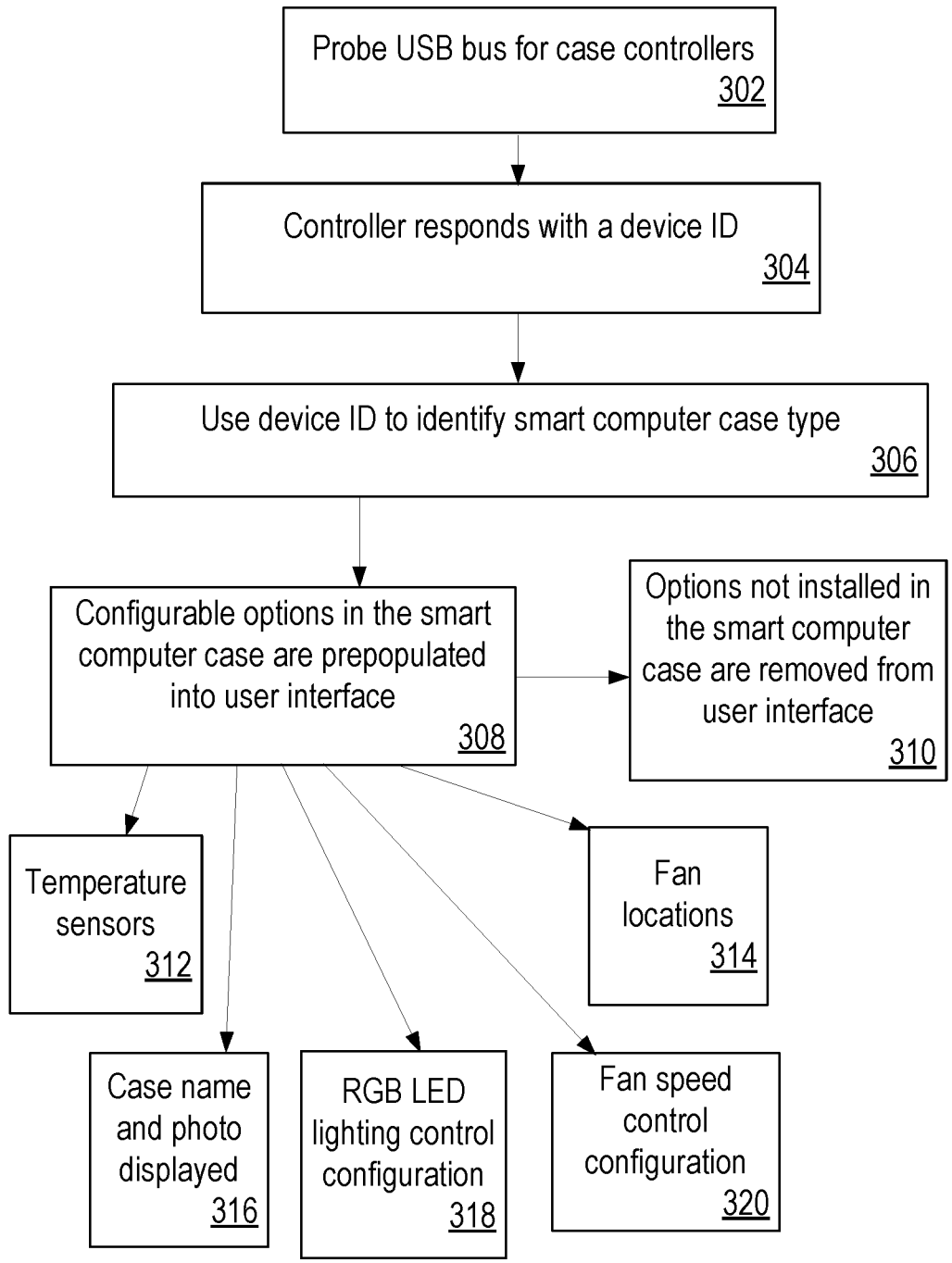
FIG. 3 is a high-level flow chart that illustrates the functions of the micro controller unit that is associated with the smart computer case, according to certain embodiments.

FIG. 3 is a high-level flow chart that illustrates some of the functions of the micro controller unit that is associated with the smart computer case, according to certain embodiments. FIG. 3 shows that, according to certain embodiments, at block 302, a software application on the host computer housed by smart computer case 100 probes the USB bus of the host computer to discover any smart case controllers (e.g., MCU 101) installed in the host computer. For example, upon discovering MCU 101, the software application causes a controller read instruction to be sent to MCU 101.

At block 304, the smart computer case controller (MCU 101) responds the read instruction by sending the ID of the smart computer case (e.g., ID of the smart computer case 100) to the software application. The ID of the smart computer case indicates the type and model of the smart computer case.

At block 306, the software application uses the received ID information to identify the type and model of the smart computer case. As a non-limiting example, the software application uses a look-up table to identify the type and model of the smart computer case based on the ID information. For example, the look-up table is stored in the hard drive of the host computer housed by the smart computer case.

As a result, at block 308, the software application displays and pre-populates configurable options in a configuration user interface for use by the end-user. As a non-limiting example, based on the ID information of the smart computer case, the user interface displays 316 a photo and name of the smart computer case (the photo can show the location of the RGB computer case fans, the integrated lighting effects and logo panel, and of other computer components).

The pre-populated configuration user interface shows temperature sensors information 312, RGB fan locations 314, RGB LED lighting control configuration 318, and fan speed control configuration 320. According to certain embodiments, the configurable options corresponding to components that have not been installed in the smart computer case can be de-populated. For example, if smart computer case has six slots available for installing RGB computer case fans and only five RGB computer case fans have been installed in the smart computer case, then the configurable options corresponding to the sixth RGB fan slot are de-populated. Similarly, if smart computer case has three slots available for installing RGB LED lighting strips and only two RGB LED lighting strips have been installed in the smart computer case, then the configurable options corresponding to the third RGB LED lighting strip are de-populated. Similarly, if smart computer case has three slots available for installing temperature sensors and only one temperature sensor has been installed in the smart computer case, then the configurable options corresponding to the second and third temperature sensors are de-populated.

Thus, an end-user can use the user interface to input control options such as RGB LED lighting effects of each RGB LED associated with the RGB logo panel, RGB lighting strips and the integrated RDG LED lighting features. Such user input options are sent to the MCU (e.g., MCU 101) which, in turn, controls each addressable RGB LED per user input. Further, the end-user can use the user interface to input control options such as RGB fan speed. For example, the user can specify the RPM of the fan. This fan speed user input is sent to the MCU (e.g., MCU 101) which, in turn, controls the fan speed of one or more RGB computer case fans installed in the smart computer case. The user interface also displays temperature output from the temperature sensors installed in the smart computer case, according to certain embodiments.

According to certain embodiments, the ID of the smart computer case is flashed onto MCU 101 when MCU 101 is factory installed in the smart computer case during manufacture of the smart computer case. According to certain other embodiments, the ID of the smart computer case is stored on a factory installed chip in the smart computer case during manufacture of the smart computer case. In such a case, MCU 101 can read the ID information form the factory installed chip.

Figure 4:
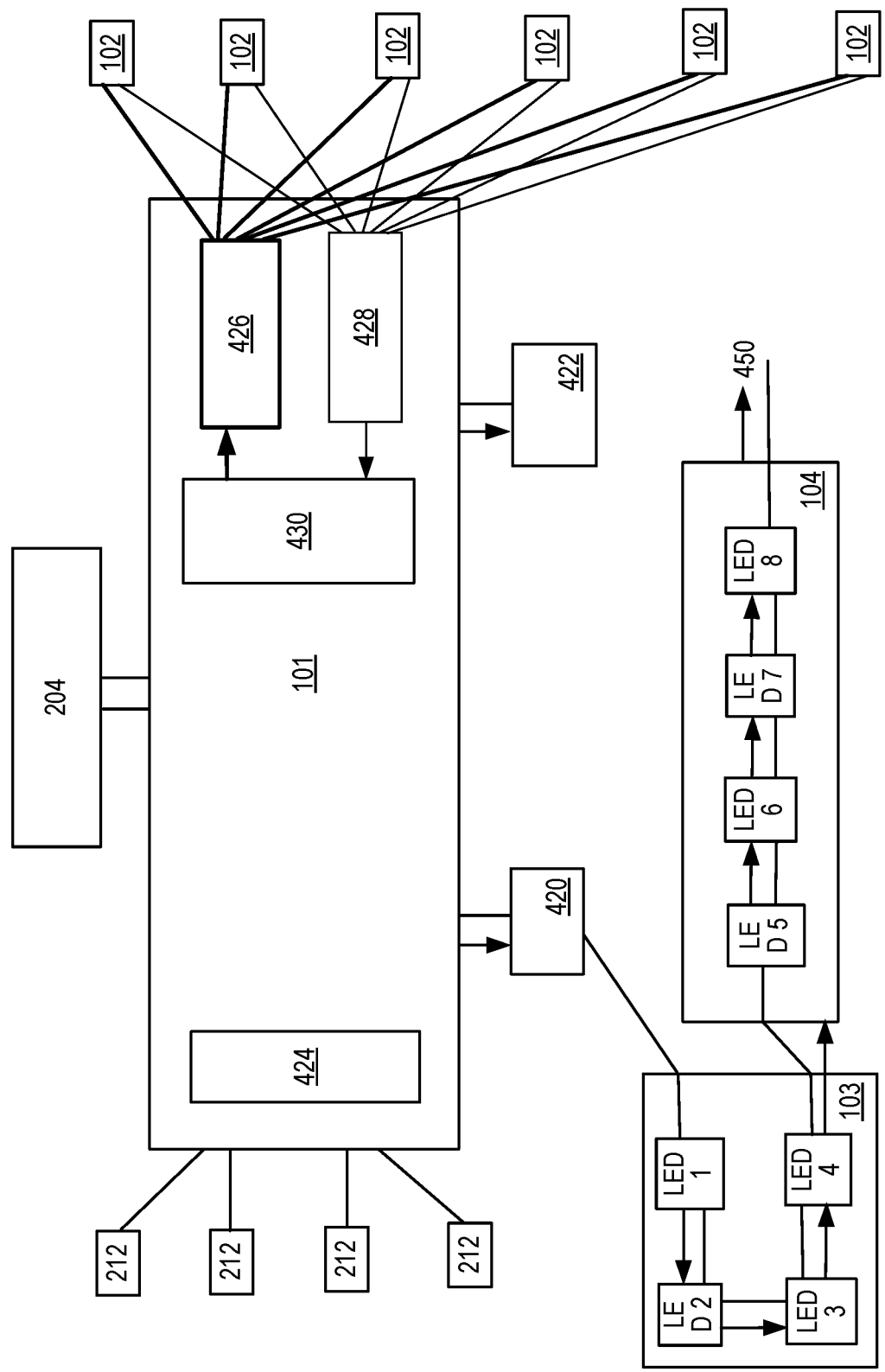
FIG. 4 is a high-level block diagram of some of the control functions of the micro controller unit associated with the control and monitoring of various components of the smart computer case, according to certain embodiments.

FIG. 4 is a high-level block diagram of some of the control functions of the micro controller unit associated with the control and monitoring of various components of the smart computer case, according to certain embodiments. FIG. 4 shows that MCU 101 can control each of RGB LEDs of the RGB logo 103 and each RGB LED of the integrated lighting effects 104 through LED port 420. Further, as an option, the RGB lighting of other computer peripherals or components may also be controlled (450 output to optional customer/user supplied RGB peripherals or components), if so desired by the customer/end-user, through LED port 420. LED port 422 may be used to control the RGB lighting of the RGB computer case fans 102 (fans 1 through 6 are shown in FIG. 4. There may be more or less number of fans, depending on the smart computer case model and the preference of the end-user). According to certain embodiments, there be only one LED port through which MCU 101 can control each of the addressable RGB LEDs associated with any lighting that is integrated as part of the smart computer case and/or any RGB devices that are pre-installed in the smart computer case (e.g., RGB fans can be pre-installed or factory-installed during manufacture of the smart computer case). According to certain other embodiments, there may be more than 2 LED ports for controlling addressable RGB LEDs associated with a plurality of RGB peripherals or components and or lighting features that are integrated as part of the smart computer case. MCU 101 can control the fan speed of RGB computer case fans 102 using PWM (pulse width modulation) signal generators 426. MCU 101 can receive fan speed tachometer readings using tachometer counters/timers 428. Information associated with PWM signal generators 426 and tachometer counters/timers 428 are stored at internal memory 430 of MCU 101. Further, MCU 101 can receive temperature readings from temperature sensors 212. MCU 101 can convert analog temperature data to digital data using analog-to-digital converter 424. MCU 101 communicates with the host computer that is housed by the smart computer case through USB interface 204. According to certain embodiments, an end-user may configure the RGB lighting effects, and fan speed control through a user interface. Thus, the end-user's configuration inputs can be communicated to MCU 101 through USB interface 204, according to certain embodiments.

Each of the RGB LEDs of the plurality of RGB computer case fans 102 can be individually controlled by MCU 101 by connecting the RGB LEDs of fans 102 to a multi-port LED hub (also referred to as a data distributor device). Further, each of the RGB LEDs of the one or more strips of RGB LED lighting can also controlled by MCU 101 by connecting strips of RGB LED lighting to the LED hub/data distributor device. The LED hub/data distributor communicates with MCU 101 through LED port 422, for example. The manner in which each of the RGB LEDs mentioned above can be controlled/programmed is described in provisional application 62/442,414, entitled "Control System For Controlling LEDs in Multiple LED Computer Fans", by inventor Robert Michael Kinstle III, filed on Jan. 4, 2017, and application Ser. No. 15/861,682, entitled "Control System For Controlling LEDs in Multiple LED Computer Fans", by inventor Robert Michael Kinstle III, filed on Jan. 4, 2018 and both of which are hereby incorporated by reference in their entirety.

According to certain embodiments, the smart computer case comprises: one or more integrated logo panels; one or more integrated lighting feature panels; a plurality fan mounts for mounting a plurality of computer case fans; and a micro controller unit. According to certain embodiments, the micro controller unit comprises (1) at least a first LED port for controlling, based on the ID of the smart computer case, lighting of a first plurality of individually addressable LEDs associated with the one or more integrated logo panels and the one or more integrated lighting feature panels; (2) at least a second LED port for controlling, based on the ID of the smart computer case, lighting of a second plurality of individually addressable LEDs associated with the plurality of computer case fans. According to certain embodiments, the plurality of individually addressable LEDs are RGB LEDs.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

I claim:

1. A smart computer case comprising:
    one or more integrated logo panels;
    one or more integrated lighting feature panels;
    a plurality fan mounts for mounting a plurality of computer case fans; and
    a micro controller unit;
    wherein,
        the micro controller unit comprises:
            at least a first LED port for controlling, based on an identification data of the smart computer case, lighting of a first plurality of individually addressable LEDs associated with integrated lighting features of the smart computer case and any pre-installed LED computer components in the smart computer case.

2. The smart computer case of claim 1, wherein the micro controller unit further comprises at least a second LED port for controlling, based on the identification data of the smart computer case, lighting of a second plurality of individually addressable LEDs associated with a plurality of LED computer components that installed in the smart computer case by a user.

3. The smart computer case of claim 2, wherein the first and second plurality of individually addressable LEDs are any one of RGB LEDs or single color LEDs.

4. The smart computer case of claim 1, wherein the micro controller unit further comprises an analog to digital converter for converting analog temperature data, received from one or more temperature sensors installed in the smart computer case, to digital data.

5. The smart computer case of claim 1, wherein the micro controller unit further comprises an internal memory for storing information associated with a plurality of PWM signal generators and a plurality tachometer counters.

6. The smart computer case of claim 1, wherein the micro controller unit further comprises a plurality of PWM signal generators for generating PWM signals for controlling fan speed of the plurality of computer case fans.

7. The smart computer case of claim 1, wherein the micro controller unit further comprises a plurality PWM pin connectors.

8. The smart computer case of claim 1, wherein the micro controller unit further comprises a plurality tachometer counters for receiving fan speed data from the plurality of computer case fans.

9. The smart computer case of claim 1, wherein the micro controller unit further comprises a plurality tachometer counter pin connectors.

10. The smart computer case of claim 1, wherein the micro controller unit further comprises a bi-directional connector to a host computer housed by the smart computer case.

11. The smart computer case of claim 1, wherein the micro controller unit further comprises a plurality of temperature sensor pin connectors.

12. The smart computer case of claim 1, wherein the ID of the smart computer case is flashed onto the micro controller unit when the micro controller unit is factory-installed in the smart computer case during manufacture of the smart computer case.

13. The smart computer case of claim 1, further comprises a factory-installed chip that stores the ID of the smart computer case during manufacture of the smart computer case.

14. The smart computer case of claim 1, wherein the micro controller unit communicates with a host computer USB bus through any one of: a USB interface, Wifi, Bluetooth, or wireless USB.

* * * * *